(12) United States Patent
Cheng et al.

(10) Patent No.: US 9,466,567 B2
(45) Date of Patent: Oct. 11, 2016

(54) NANOWIRE COMPATIBLE E-FUSE

(71) Applicant: GLOBALFOUNDRIES INC., Grand Cayman (KY)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 47 days.

(21) Appl. No.: 14/957,842

(22) Filed: Dec. 3, 2015

(65) Prior Publication Data
US 2016/0086886 A1    Mar. 24, 2016

Related U.S. Application Data

(62) Division of application No. 14/020,096, filed on Sep. 6, 2013, now Pat. No. 9,214,567.

(51) Int. Cl.
| | | |
|---|---|---|
| H01L 27/11 | (2006.01) | |
| H01L 23/525 | (2006.01) | |
| H01L 29/786 | (2006.01) | |
| H01L 29/66 | (2006.01) | |
| H01L 29/06 | (2006.01) | |
| H01L 29/423 | (2006.01) | |
| H01L 23/62 | (2006.01) | |

(52) U.S. Cl.
CPC ............ *H01L 23/5256* (2013.01); *H01L 23/62* (2013.01); *H01L 29/0649* (2013.01); *H01L 29/0673* (2013.01); *H01L 29/42392* (2013.01); *H01L 29/66742* (2013.01); *H01L 29/78696* (2013.01)

(58) Field of Classification Search
CPC .................................................. H01L 23/5256
USPC .......................................................... 257/379
See application file for complete search history.

(56) References Cited

U.S. PATENT DOCUMENTS

| | | |
|---|---|---|
| 6,584,029 B2 | 6/2003 | Tran et al. |
| 6,611,039 B2 | 8/2003 | Anthony |
| 6,624,499 B2 | 9/2003 | Kothandaraman et al. |
| 7,023,055 B2 | 4/2006 | Ieong et al. |
| 7,329,923 B2 | 2/2008 | Doris et al. |
| 7,741,697 B2 | 6/2010 | Chen |
| 7,777,296 B2 | 8/2010 | Yang et al. |
| 8,232,190 B2 | 7/2012 | Bernstein et al. |
| 8,294,239 B2 | 10/2012 | Min |
| 8,344,428 B2 | 1/2013 | Chakravarti et al. |
| 2005/0116290 A1 | 6/2005 | De Souza et al. |
| 2007/0120218 A1 | 5/2007 | Hsu et al. |
| 2009/0085152 A1 | 4/2009 | Bernstein et al. |
| 2009/0090993 A1* | 4/2009 | Henson ............... H01L 23/5256 257/529 |
| 2011/0316145 A1 | 12/2011 | Tsao et al. |

* cited by examiner

*Primary Examiner* — Ajay K Arora
(74) *Attorney, Agent, or Firm* — Scully, Scott, Murphy & Presser, P.C.

(57) ABSTRACT

An e-fuse is provided in one area of a semiconductor substrate. The E-fuse includes a vertical stack of from, bottom to top, base metal semiconductor alloy portion, a first metal semiconductor alloy portion, a second metal semiconductor portion, a third metal semiconductor alloy portion and a fourth metal semiconductor alloy portion, wherein the first metal semiconductor alloy portion and the third metal semiconductor portion have outer edges that are vertically offset and do not extend beyond vertical edges of the second metal semiconductor alloy portion and the fourth metal semiconductor alloy portion.

18 Claims, 4 Drawing Sheets

NANOWIRE COMPATIBLE E-FUSE

RELATED APPLICATION

This application is a divisional of U.S. Ser. No. 14/020,096, filed Sep. 6, 2013, the entire contents of which are incorporated herein by reference.

BACKGROUND

The present application relates to a semiconductor structure and a method of forming the same. More particularly, the present application relates to an E-fuse that is compatible with nanowire based technology and a method of forming such an E-fuse.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor nanowire field effect transistors (FETs), is the next step in the evolution of CMOS devices. Formation of semiconductor nanowire FETs is known. However, there is a need for providing nanowire electrically programmable fuses that can be used in forming integrated circuits that contain semiconductor nanowire FETs.

SUMMARY

In one aspect of the present application, a method of forming a semiconductor structure is provided. In one embodiment, the method of the present application includes forming a multilayered epitaxial semiconductor material stack of, from bottom to top, a first semiconductor layer, a second semiconductor layer, a third semiconductor layer and a fourth semiconductor layer on an uppermost surface of a semiconductor substrate. Next, the multilayered epitaxial semiconductor material stack is patterned into a first patterned material stack containing, from bottom to top, a first semiconductor portion, a second semiconductor portion, a third semiconductor portion and a fourth semiconductor portion. An isolation structure is formed on each exposed portion of the semiconductor substrate and at a footprint of the first patterned material stack. Next, a lateral etch is performed in which a width of exposed portions of the first semiconductor portion of the first patterned material stack and a width of the third semiconductor portion of the first patterned material stack are narrowed, while maintaining a width of the second semiconductor portion and a width of the fourth semiconductor portion. The etched first semiconductor portion is then converted into a first metal semiconductor alloy portion, the second semiconductor portion is converted into a second metal semiconductor alloy portion, the etched third semiconductor alloy portion is converted into a third metal semiconductor alloy portion and the fourth semiconductor portion is converted into a fourth metal semiconductor alloy portion. In accordance with the present application, outer edges of the first and third metal semiconductor alloy portions are vertically offset and do not extend beyond outer edges of the second and fourth metal semiconductor alloy portions.

In another embodiment, the method of the present application includes forming a multilayered epitaxial semiconductor material stack of, from bottom to top, a first semiconductor layer, a second semiconductor layer, a third semiconductor layer and a fourth semiconductor layer on an uppermost surface of a semiconductor substrate. Next, the multilayered epitaxial semiconductor material stack is patterned into a first patterned material stack containing, from bottom to top, a first semiconductor portion, a second semiconductor portion, a third semiconductor portion and a fourth semiconductor portion on one portion of the semiconductor substrate and a second patterned material stack containing, from bottom to top, another first semiconductor portion, another second semiconductor portion, another third semiconductor portion and another fourth semiconductor portion on another portion of the semiconductor substrate, wherein the first patterned material stack has a first width and the second patterned material stack has a second width that is less than the first width. An isolation structure is then formed on each exposed portion of the semiconductor substrate and at a footprint of the first patterned material stack and the second patterned material stack. Next, a lateral etch is performed in which a width of exposed portions of the first semiconductor portion of the first patterned material stack and a width of the third semiconductor portion of the first patterned material stack are narrowed, while maintaining a width of the second semiconductor portion and a width of the fourth semiconductor portion, and simultaneously removing the another first semiconductor portion and the another third semiconductor portion from the second patterned material stack and suspending the another second semiconductor portion and the another fourth semiconductor portion of the second patterned material stack. A gate structure is formed surrounding the suspended another second semiconductor portion and the suspended another fourth semiconductor portion of the second patterned material stack. After forming the gate structure, the etched first semiconductor portion is then converted into a first metal semiconductor alloy portion, the second semiconductor portion is converted into a second metal semiconductor alloy portion, the etched third semiconductor alloy portion is converted into a third metal semiconductor alloy portion and the fourth semiconductor portion is converted into a fourth metal semiconductor alloy portion. In accordance with the present application, outer edges of the first and third metal semiconductor alloy portions are vertically offset and do not extend beyond outer edges of the second and fourth metal semiconductor alloy portions.

In another aspect of the present application, an E-fuse is provided in one area of a semiconductor substrate. The E-fuse includes a vertical stack of from, bottom to top, a base metal semiconductor alloy portion, a first metal semiconductor alloy portion, a second metal semiconductor portion, a third metal semiconductor alloy portion and a fourth metal semiconductor alloy portion, wherein the first metal semiconductor alloy portion and the third metal semiconductor portion have outer edges that are vertically offset and do not extend beyond vertical edges of the second metal semiconductor alloy portion and the fourth metal semiconductor alloy portion.

DETAILED DESCRIPTION

Figure 1:
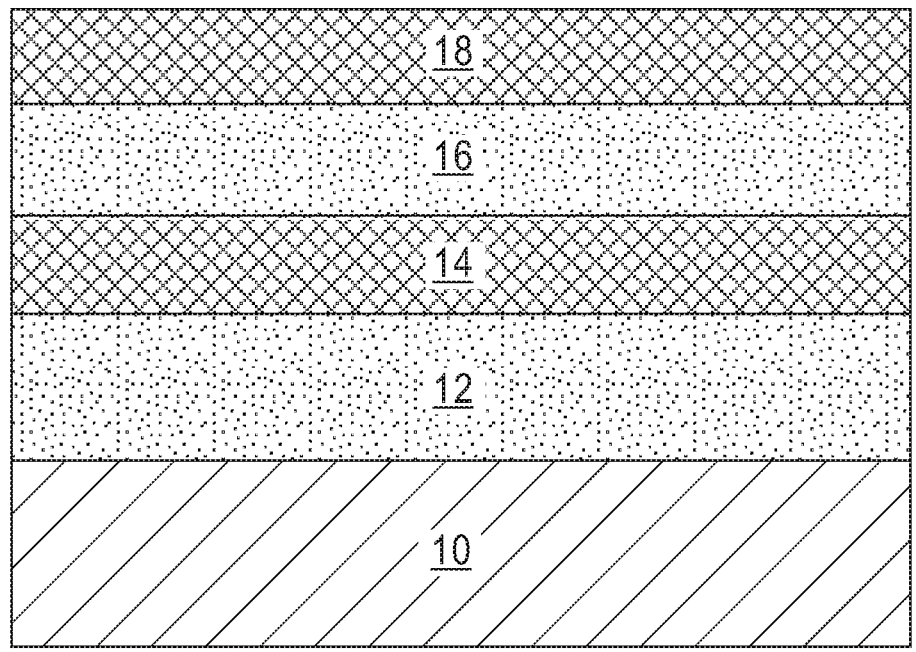
FIG. 1 is a cross sectional view of an exemplary semiconductor structure including a multilayered epitaxial semiconductor material stack of, from bottom to top, a first semiconductor layer, a second semiconductor layer, a third semiconductor layer and a fourth semiconductor layer located on an uppermost surface of a semiconductor substrate.

The present application will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Electrically programmable fuses (E-fuses) have been widely used in a variety of electronic applications such as re-routing circuits. Passing current through the E-fuse results in the electromigration of the metal semiconductor alloy material in the E-fuse. Electromigration refers to the transport of material caused by the gradual movement of ions in a conductor due to momentum transfer between conducting electrons and diffusing metal atoms. With respect to E-fuses, electromigration results in a higher resistance in the E-fuse, effectively making the e-Fuse act as an open circuit. Conventional E-fuses occupy a large area of a semiconductor chip. Furthermore, conventional e-Fuses become less compatible with nanowire CMOS technology. As such, there is a need to form an e-Fuse that is compatible with existing nanowire technology.

Referring first to FIG. 1, there is illustrated an exemplary semiconductor structure including a multilayered epitaxial semiconductor material stack of, from bottom to top, a first semiconductor layer 12, a second semiconductor layer 14, a third semiconductor layer 16 and a fourth semiconductor layer 18 located on an uppermost surface of a semiconductor substrate 10.

In some embodiments of the present application, the semiconductor substrate 10 can be a bulk semiconductor substrate. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In one embodiment, the semiconductor substrate 10 can be comprised of a single crystalline semiconductor material, such as, for example, single crystalline silicon. In other embodiments, the semiconductor substrate 10 may comprise a polycrystalline or amorphous semiconductor material.

In another embodiment, a semiconductor-on-insulator (SOI) substrate (not specifically shown) can be employed as the semiconductor substrate 10. Although not specifically shown, one skilled in the art understands that an SOI substrate includes a handle substrate, a buried insulator layer located on an upper surface of the handle substrate, and a semiconductor layer located on an upper surface of the buried insulator layer. The handle substrate provides mechanical support for the buried insulator layer and the semiconductor layer.

The handle substrate and the semiconductor layer of the SOI substrate may comprise the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and a semiconductor layer can be used as semiconductor substrate 10.

In some embodiments, the handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 100 Å to 1000 Å. In another example, the thickness of the semiconductor layer of the SOI substrate can be from 500 Å to 700 Å. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above. The buried insulator layer of the SOI substrate typically has a thickness from 10 Å to 2000 Å, with a thickness from 1000 Å to 1500 Å being more typical. The thickness of the handle substrate of the SOI substrate is inconsequential to the present application.

In some other embodiments, hybrid semiconductor substrates which have different surface regions of different crystallographic orientations can be employed as semiconductor substrate 10. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 10 may be doped, undoped or contain doped and undoped regions therein. For clarity, the doped regions are not specifically shown in the drawings of the present application. Each doped region within the semiconductor material of the semiconductor substrate 10 may have the same, or they may have different conductivities and/or doping concentrations. The doped regions that are present in the semiconductor material of semiconductor substrate 10 are typically referred to as well regions and they are formed utilizing a conventional ion implantation process or gas phase doping.

After providing the semiconductor substrate 10, a multilayered epitaxial semiconductor material stack of, from bottom to top, a first semiconductor layer 12, a second semiconductor layer 14, a third semiconductor layer 16 and a fourth semiconductor layer 18 is formed on an uppermost surface of the semiconductor substrate 10. The uppermost surface of the semiconductor material includes a topmost semiconductor portion, e.g., an uppermost semiconductor layer of a bulk substrate or the semiconductor layer of an SOI substrate, of the semiconductor substrate 10.

The term "epitaxial" denotes that all the semiconductor layers of the multilayered epitaxial semiconductor material stack have an epitaxial relationship, i.e., same crystal structure, with each other. Also, the first semiconductor layer 12 of the multilayered epitaxial semiconductor material stack of the present application has an epitaxial relationship with a topmost surface of the semiconductor substrate 10 in which the first semiconductor layer 12 is formed thereon.

The first semiconductor layer 12 of the multilayered epitaxial semiconductor material stack of the present application is comprised of a first semiconductor material that is different in composition and/or doping from the topmost semiconductor material portion of the semiconductor substrate 10. As such, the first semiconductor layer 12 of the multilayered epitaxial semiconductor material stack of the present application has a different etch selectivity as compared to the topmost semiconductor material portion of the semiconductor substrate 10. The first material that provides the first semiconductor layer 12 of the multilayered epitaxial semiconductor material stack of the present application can be selected from Si, Ge, SiGe, SiC, SiGeC, and III/V compound semiconductors.

In one embodiment, the first semiconductor material that provides the first semiconductor layer 12 of the multilayered epitaxial semiconductor material stack may comprise a different semiconductor material than that of the topmost semiconductor material portion of semiconductor substrate 10. In one example, the first semiconductor material that provides the first semiconductor layer 12 of the multilayered epitaxial semiconductor material stack may comprise SiGe, while the topmost semiconductor material portion of semiconductor substrate 10 may comprise Si. In this embodiment of the present application, the first semiconductor material that provides the first semiconductor layer 12 of the multilayered epitaxial semiconductor material stack and the topmost semiconductor material portion of semiconductor substrate 10 may be both doped, or one can be doped and the other can be non-doped.

In another embodiment, the first semiconductor material that provides the first semiconductor layer 12 of the multilayered epitaxial semiconductor material stack may doped, while the topmost semiconductor material portion of semiconductor substrate 10 may non-doped. In this embodiment, the first semiconductor material and the topmost semiconductor material portion of the semiconductor substrate 10 comprise a same semiconductor material. In one example, the first semiconductor material that provides the first semiconductor layer 12 of the multilayered epitaxial semiconductor material stack may comprise doped Si, while the topmost semiconductor material portion of semiconductor substrate 10 may comprise undoped Si. In another example, the first semiconductor material that provides the first semiconductor layer 12 of the multilayered epitaxial semiconductor material stack may comprise doped SiGe, while the topmost semiconductor material portion of semiconductor substrate 10 may comprise undoped SiGe. In this embodiment, the dopant that is present in the first semiconductor material that provides the first semiconductor layer 12 of the multilayered epitaxial semiconductor material stack provides a different etch selectivity to the first semiconductor layer 12 as compared to the topmost semiconductor material portion of semiconductor substrate 10.

In a further embodiment, the first semiconductor material that provides the first semiconductor layer 12 of the multilayered epitaxial semiconductor material stack may non-doped, while the topmost semiconductor material portion of semiconductor substrate 10 may doped. In this embodiment, the first semiconductor material and the topmost semiconductor material portion of the semiconductor substrate 10 comprise a same semiconductor material. In one example, the first semiconductor material that provides the first semiconductor layer 12 of the multilayered epitaxial semiconductor material stack may comprise non-doped Si, while the topmost semiconductor material portion of semiconductor substrate 10 may comprise doped Si. In another example, the first semiconductor material that provides the first semiconductor layer 12 of the multilayered epitaxial semiconductor material stack may comprise non-doped SiGe, while the topmost semiconductor material portion of semiconductor substrate 10 may comprise doped SiGe. In this embodiment, the non-doped first semiconductor material that provides the first semiconductor layer 12 of the multilayered epitaxial semiconductor material stack provides a different etch selectivity to the first semiconductor layer 12 as compared to the topmost semiconductor material portion of semiconductor substrate 10.

In any of the embodiments mentioned above in which a dopant is present, the dopant may be an element from either Group IIIA (e.g., one of B, Al, Ga and/or In) or VA (e.g., one of P, As, and/or Sb) of the Periodic Table of Elements. In one example, the dopant may be present in a concentration ranging from $1\times10^{17}$ atoms/cm$^3$ to $5\times10^{20}$ atoms/cm$^3$. In another example, the dopant may be present in a concentration ranging from $5\times10^{17}$ atoms/cm$^3$ to $5\times10^{19}$ atoms/cm$^3$.

In embodiments in which the dopant is present in the first semiconductor material that provides the first semiconductor layer 12 of the multilayered epitaxial semiconductor material stack, the dopant may be introduced using an in-situ doping process. By "in-situ" it is meant that the dopant that provides the conductivity type of the material layer is introduced as the material layer is being formed or deposited, e.g., during the epitaxial deposition process. For example, when doping the semiconductor material concurrently with the epitaxial growth process, a gas source for the dopant is introduced to the semiconductor material being grown simultaneously with the gas source that provides the precursor for epitaxially forming the semiconductor material. In-situ doping is differentiated from ion implantation that occurs after the semiconductor material has been formed. In one example, in which the dopant that is present in the first semiconductor material that provides the first semiconductor layer 12 of the multilayered epitaxial semiconductor material stack includes boron (B), the gaseous dopant sources for in-situ doping include $B_2H_6$, $BCl_3$ and combinations thereof.

In other embodiments, the dopant that is present in the first semiconductor material that provides the first semiconductor layer 12 of the multilayered epitaxial semiconductor material stack may be introduced using ion implantation after formation of a non-doped first semiconductor material. In yet other embodiments, the dopant may be introduced by gas phase doping, or by depositing a doped sacrificial layer and diffusing the dopant from the doped sacrificial material into a non-doped first semiconductor material.

When the dopant is present in the topmost semiconductor layer portion of the semiconductor substrate 10, one of the above mentioned dopants can be introduced into the topmost semiconductor layer portion of the semiconductor substrate 10, prior to forming the first semiconductor layer 12 of the multilayered epitaxial semiconductor material stack utilizing one of ion implantation, gas phase doping, out-diffusion from a doped sacrificial material and an in-situ epitaxial growth process.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surfaces, and do not deposit material on dielectric surfaces, such as silicon oxide or silicon nitride surfaces.

Examples of various epitaxial growth process apparatuses that are suitable for use in forming the first semiconductor material that provides the first semiconductor layer 12 of the multilayered epitaxial semiconductor material stack of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) or molecular beam epitaxy (MBE). Epitaxial deposition of the first semiconductor material that provides the first semiconductor layer 12 of the multilayered epitaxial semiconductor material stack may be performed at a temperature of from 550° C. to 900° C. Although higher temperature typically results in faster deposition, the faster deposition may result in crystal defects and film cracking.

A number of different sources may be used for the deposition of the first semiconductor material that provides the first semiconductor layer 12 of the multilayered epitaxial semiconductor material stack. In some embodiments, the gas source for the deposition of the first semiconductor material that provides the first semiconductor layer 12 of the multilayered epitaxial semiconductor material stack includes a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

In some embodiments, the epitaxial growth of the first semiconductor material that provides the first semiconductor layer 12 of the multilayered epitaxial semiconductor material stack can include a dopant source gas used in conjunction with the source gas; such a process may be referred to herein as an in-situ doping epitaxial growth process. The dopant source gas that can be present in the epitaxial growth process may include a p-type dopant source gas or an n-type dopant source gas.

For example, when phosphorus is the n-type dopant, the dopant source gas can be phosphine ($PH_3$), and when arsenic is the n-type dopant, the dopant source gas can be arsine ($AsH_3$). In one example, when the conductivity type dopant is n-type, the dopant source gas include phosphine gas ($PH_3$) present in a ratio to silane ($SiH_4$) ranging from 0.00001% to 2%. In another example, when the conductivity type dopant is n-type, the dopant source gas include phosphine gas ($PH_3$) present in a ratio to silane ($SiH_4$) ranging from 0.0001% to 0.1%.

In yet a further when example and when boron is the p-type dopant, the dopant source gas can be diborane ($B_2H_6$). In one embodiment, wherein the conductivity type dopant is p-type, the dopant source gas may be diborane ($B_2H_6$) present in a ratio to silane ($SiH_4$) ranging from 0.00001% to 2%. In another embodiment, wherein the conductivity type dopant is p-type, the dopant source gas may be diborane ($B_2H_6$) present in a ratio to silane ($SiH_4$) ranging from 0.0001% to 0.1%. In yet another embodiment, in which the conductivity type dopant is p-type, the dopant gas for may be trimethylboron (TMB) present in a ratio to silane ($SiH_4$) ranging from 0.1% to 10%.

In one embodiment, the thickness of the first semiconductor layer 12 of the multilayered epitaxial semiconductor material stack may range from 10 nm to 200 nm. Other thicknesses that are greater than or lesser than the aforementioned thickness range can also be used for first semiconductor layer 12 of the multilayered epitaxial semiconductor material stack.

The second semiconductor layer 14 of the multilayered epitaxial semiconductor material stack is comprised of a second semiconductor material that is different in composition and/or doping from the first semiconductor material that provides the first semiconductor layer 12 of the multilayered epitaxial semiconductor material stack. The second semiconductor material that provides the second semiconductor layer 14 of the multilayered epitaxial semiconductor material stack is however of the same composition and doping as the topmost semiconductor portion of the semiconductor substrate 10. As such, the second semiconductor layer 14 of the multilayered epitaxial semiconductor material stack of the present application has a different etch selectivity as compared to the first semiconductor layer 12 of the multilayered epitaxial semiconductor material stack of the present application, yet the same etch selectivity as compared to the topmost semiconductor portion of the semiconductor substrate 10. The second semiconductor material that provides the second semiconductor layer 14 of the multilayered epitaxial semiconductor material stack of the present application can be selected from Si, Ge, SiGe, SiC, SiGeC, and III/V compound semiconductors.

In one embodiment, the second semiconductor material that provides the second semiconductor layer 14 of the multilayered epitaxial semiconductor material stack may comprise a different semiconductor material than that of the first semiconductor material that provides the first semiconductor layer 12 of the multilayered epitaxial semiconductor material stack. In one example, the second semiconductor material that provides the second semiconductor layer 14 of the multilayered epitaxial semiconductor material stack may comprise Si, while the first semiconductor material that provides the first semiconductor layer 12 of the multilayered epitaxial semiconductor material stack may comprise SiGe. In this embodiment of the present application, the second semiconductor material that provides the second semiconductor layer 14 of the multilayered epitaxial semiconductor material stack and the first semiconductor material that provides the first semiconductor layer 12 of the multilayered epitaxial semiconductor material stack may be both doped, or one can be doped and the other can be non-doped.

In another embodiment, the second semiconductor material that provides the second semiconductor layer 14 of the multilayered epitaxial semiconductor material stack may be non-doped, while the first semiconductor material that provides the first semiconductor layer 12 of the multilayered epitaxial semiconductor material stack may doped. In this embodiment, the first and second semiconductor materials can be a same semiconductor material. In one example, the second semiconductor material that provides the second semiconductor layer 14 of the multilayered epitaxial semiconductor material stack may comprise undoped Si, while the first semiconductor material that provides the first semiconductor layer 12 of the multilayered epitaxial semiconductor material stack may comprise doped Si. In another example, the second semiconductor material that provides the second semiconductor layer 14 of the multilayered epitaxial semiconductor material stack may comprise undoped SiGe, while the first semiconductor material that provides the first semiconductor layer 12 of the multilayered epitaxial semiconductor material stack may comprise doped SiGe. In this embodiment, the undoped second semiconductor material that provides the second semiconductor layer 14 of the multilayered epitaxial semiconductor material stack provides a different etch selectivity to the second semiconductor layer 14 as compared to the first semiconductor layer 12.

In a further embodiment, the second semiconductor material that provides the second semiconductor layer 14 of the multilayered epitaxial semiconductor material stack may doped, while first semiconductor material that provides the first semiconductor layer 12 of the multilayered epitaxial semiconductor material stack may undoped. In this embodiment, the first and second semiconductor materials can be a same semiconductor material. In one example, the second semiconductor material that provides the second semiconductor layer 14 of the multilayered epitaxial semiconductor material stack may comprise doped Si, while the first semiconductor material that provides the first semiconductor layer 12 of the multilayered epitaxial semiconductor material may comprise undoped Si. In another example, the second semiconductor material that provides the second semiconductor layer 14 of the multilayered epitaxial semiconductor material stack may comprise doped SiGe, while the first semiconductor material that provides the first semiconductor layer 12 of the multilayered epitaxial semiconductor material may comprise undoped SiGe. In this embodiment, the doped second semiconductor material that provides the second semiconductor layer 14 of the multilayered epitaxial semiconductor material stack provides a different etch selectivity to the second semiconductor layer 14 as compared to the first semiconductor layer 12.

The second semiconductor material that provides the second semiconductor layer 14 of the multilayered epitaxial semiconductor material stack may comprise a dopant and be formed utilizing one of the techniques mentioned above in forming the first semiconductor material that provides the first semiconductor layer 12 of the multilayered epitaxial semiconductor material.

In one embodiment, the thickness of the second semiconductor layer 14 of the multilayered epitaxial semiconductor material stack may range from 10 nm to 100 nm. Other thicknesses that are greater than or lesser than the aforementioned thickness range can also be used for first semiconductor layer 14 of the multilayered epitaxial semiconductor material stack.

The third semiconductor layer 16 of the multilayered epitaxial semiconductor material stack is comprised of a third semiconductor material that is different in composition and/or doping from the second semiconductor material that provides the second semiconductor layer 14 of the multilayered epitaxial semiconductor material stack. The third semiconductor material that provides the third semiconductor layer 16 of the multilayered epitaxial semiconductor material stack is of the same composition and doping as the first semiconductor material that provides the first semiconductor layer 12 of the multilayered epitaxial semiconductor material stack. As such, the first and third semiconductor layers of the multilayered epitaxial semiconductor material stack have a different etch selectivity as compared to the second semiconductor layer 14 of the multilayered epitaxial semiconductor material stack.

Since the third semiconductor material that provides the third semiconductor layer 16 of the multilayered epitaxial semiconductor material stack is of the same composition and doping as the first semiconductor material that provides the first semiconductor layer 12 of the multilayered epitaxial semiconductor material stack, the above description regarding the first semiconductor material that provides the first semiconductor layer 12 of the multilayered epitaxial semiconductor material stack also applies equally well here for the third semiconductor material that provides the third semiconductor layer 16 of the multilayered epitaxial semiconductor material stack. In one example, the first semiconductor layer 12 and the third semiconductor layer 16 comprise SiGe, while the second semiconductor layer 14 comprises Si.

The fourth semiconductor layer 18 of the multilayered epitaxial semiconductor material stack is comprised of a fourth semiconductor material that is different in composition and/or doping from the first and third semiconductor materials that provides the first and third semiconductor layers 12 and 16 of the multilayered epitaxial semiconductor material stack. The fourth semiconductor material that provides the fourth semiconductor layer 18 of the multilayered epitaxial semiconductor material stack is of the same composition and doping as the second semiconductor material that provides the second semiconductor layer 14 of the multilayered epitaxial semiconductor material stack. As such, the second and fourth semiconductor layers of the multilayered epitaxial semiconductor material stack have a different etch selectivity as compared to the first and third semiconductor layers of the multilayered epitaxial semiconductor material stack.

Since the fourth semiconductor material that provides the fourth semiconductor layer 18 of the multilayered epitaxial semiconductor material stack is of the same composition and doping as the second semiconductor material that provides the second semiconductor layer 14 of the multilayered epitaxial semiconductor material stack, the above description regarding the second semiconductor material that provides the second semiconductor layer 14 of the multilayered epitaxial semiconductor material stack also applies equally well here for the fourth semiconductor material that provides the fourth semiconductor layer 18 of the multilayered epitaxial semiconductor material stack. In one example, the first semiconductor layer 12 and the third semiconductor layer 16 comprise SiGe, while the second semiconductor layer 14 and the fourth semiconductor layer 18 comprise Si.

Figure 2:
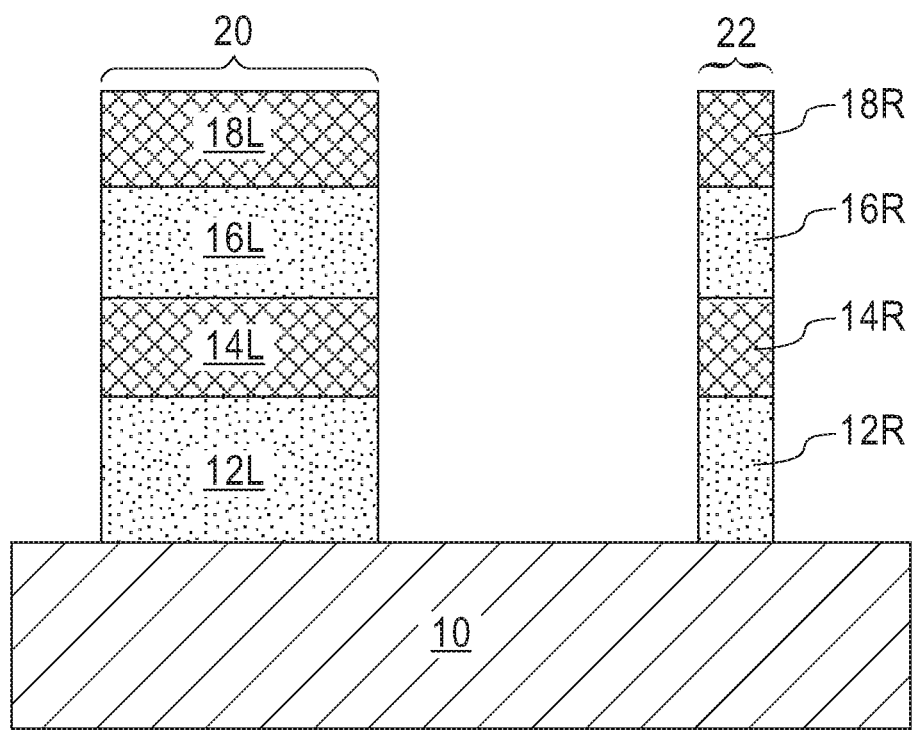
FIG. 2 is a cross sectional view of the exemplary semiconductor structure of FIG. 1 after forming a first patterned material stack containing, from bottom to top, a first semiconductor portion, a second semiconductor portion, a third semiconductor portion and a fourth semiconductor portion on one portion of the semiconductor substrate, and a second patterned material stack containing, from bottom to top, another first semiconductor portion, another second semiconductor portion, another third semiconductor portion and another fourth semiconductor portion on another portion of the semiconductor substrate.

Referring now to FIG. 2, there is illustrated the exemplary semiconductor structure of FIG. 1 after forming a first patterned material stack 20 containing, from bottom to top, a first semiconductor portion 12L, a second semiconductor portion 14L, a third semiconductor portion 16L and a fourth semiconductor portion 18L on one portion of the semiconductor substrate 10, and a second patterned material stack 22 containing, from bottom to top, another first semiconductor portion 12R, another second semiconductor portion 14R, another third semiconductor portion 16R and another fourth semiconductor portion 18R on another portion of the semiconductor substrate 10.

The first patterned material stack 20 is present in a region, i.e., area, of the semiconductor substrate 10 in which an E-fuse in accordance with the present application is formed, while the second patterned material stack 22 is present in a region, i.e., area, of the semiconductor substrate 10 in which a semiconductor nanowire FET will be formed. The first patterned material stack 20 (and corresponding elements 12L, 14L, 16L and 18L) has a first width and the second patterned material stack (and corresponding elements 12R, 14R, 16R and 18R) has a second width. The first width and the second width of the respective patterned material stacks are measured from one vertical sidewall of the patterned material stack to another vertical sidewall of the same patterned material stack.

In accordance with the present application, the first width of the first patterned material stack 20 is greater than the second width of the second patterned material stack 22. In one example, the first width of the first patterned material stack 20 is 5× greater than the second width of the second patterned material stack 22. In another example, the first width of the first patterned material stack 20 is 10× greater than the second width of the second patterned material stack 22.

The components of the first patterned material stack 20, namely, the first semiconductor portion 12L, the second semiconductor portion 14L, the third semiconductor portion 16L and the fourth semiconductor portion 18L, have outermost edges (i.e., vertical sidewalls) that are vertically coincident with each other. Likewise, the components of the second patterned material stack 22, namely the another first semiconductor portion 12R, the another second semiconductor portion 14R, the another third semiconductor portion 16R and the another fourth semiconductor portion 18R, have outermost edges (i.e., vertical sidewalls) that are vertically coincident with each other.

In accordance with the present application, the first semiconductor portion 12L and the another first semiconductor portion 12R are remaining portions of the first semiconductor layer 12 after patterning the multilayered epitaxial semiconductor material stack; the second semiconductor portion 14L and the another second semiconductor portion 14R are remaining portions of the second semiconductor layer 14 after patterning the multilayered epitaxial semiconductor material stack; the third semiconductor portion 16L and the another third semiconductor portion 16R are remaining portions of the third semiconductor layer 16 after patterning the multilayered epitaxial semiconductor material stack; and the fourth semiconductor portion 18L and the another fourth semiconductor portion 18R are remaining portions of the fourth semiconductor layer 18 after patterning the multilayered epitaxial semiconductor material stack.

The first patterned material stack 20 and the second patterned material stack 22 can be formed by lithography and etching. Lithography can include forming a photoresist (not shown) on the topmost surface of the fourth semiconductor layer 18, exposing the photoresist to a desired pattern of radiation, and then developing the exposed photoresist with a resist developer to provide a patterned photoresist on the topmost surface of the fourth semiconductor layer 18. The patterned photoresist would include at least one first opening having the first width and at least one second opening having the second width.

At least one etch is then employed which transfers the pattern from the patterned photoresist into the various semiconductor material layers. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, ammonia. In yet another embodiment, a combination of a dry etch and a wet chemical etch may be used to transfer the pattern. After transferring the pattern into the various semiconductor material layers, the patterned photoresist can be removed utilizing a resist stripping process such as, for example, ashing.

Figure 3:
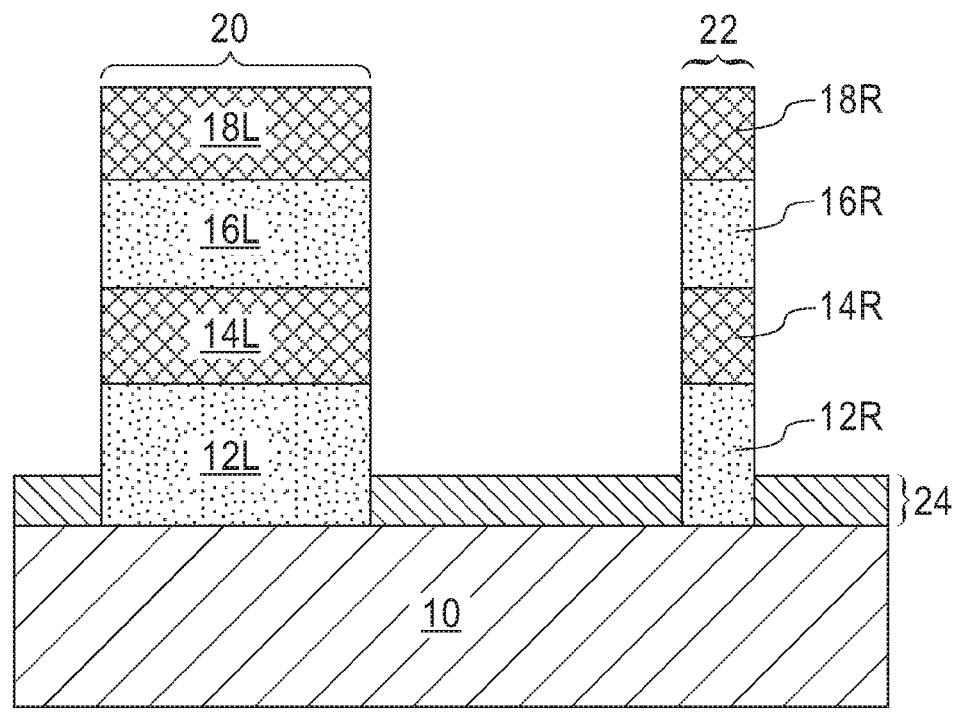
FIG. 3 is a cross sectional view of the exemplary semiconductor structure of FIG. 2 after forming an isolation structure on each exposed portion of the semiconductor substrate and at a footprint of the first patterned material stack and the second patterned material stack.

Referring now to FIG. 3, there is illustrated the exemplary semiconductor structure of FIG. 2 after forming an isolation structure 24 on each exposed portion of the semiconductor substrate 10 and at a footprint of the first patterned material stack 20 and the second patterned material stack 22. Each isolation structure 24 that can be formed has an upper surface that is located beneath and not coplanar with an uppermost surface of each patterned material stack 20, 22. The isolation structures 24 that are formed have a sidewall surface that contacts at least one of the first patterned material stack 20 and the second patterned material stack 22. In one embodiment of the present application, the height of each isolation structure 24 is from 10 nm to 100 nm, and the width of each isolation structure 24 is from 20 nm to 100 nm. In another embodiment of the present application, the height of each isolation structure 24 is from 15 nm 50 nm, and the width of each isolation structure 24 is from 25 nm to 80 nm. Each isolation structure 24 can be formed by first depositing a trench dielectric oxide, followed by chemical mechanical planarization and then an etch back process can be employed. In one embodiment of the present application, each isolation structure 24 can be formed utilizing a localized oxidation of silicon process.

Figure 4:
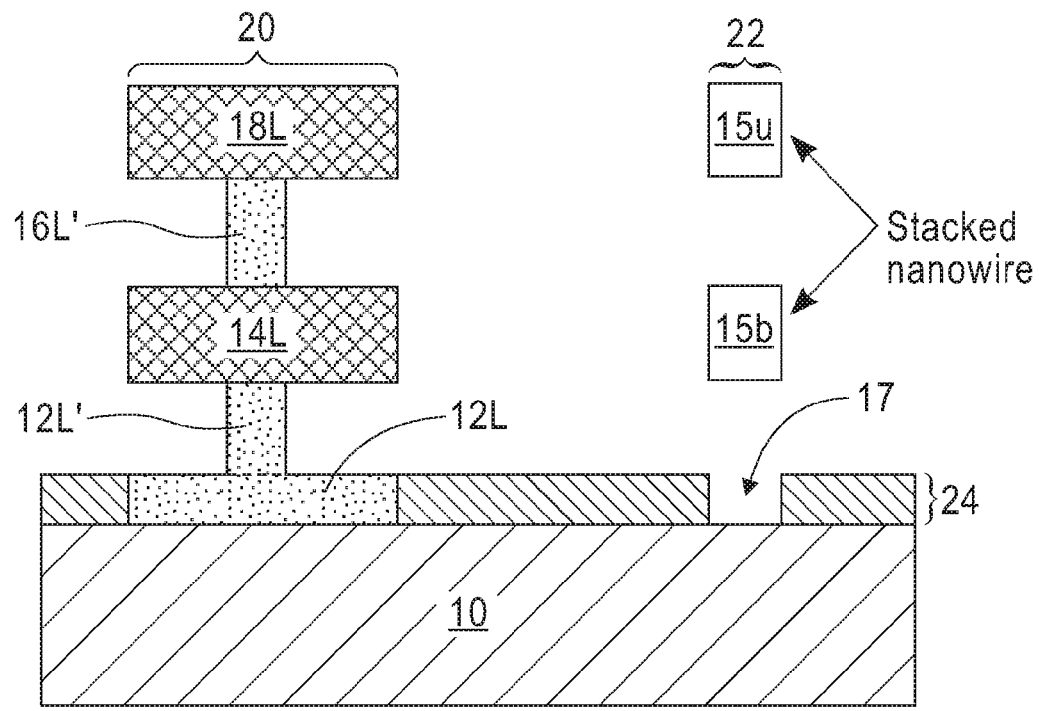
FIG. 4 is a cross sectional view of the exemplary semiconductor structure of FIG. 3 after performing a lateral etch in which a width of exposed portions of the first semiconductor portion of the first patterned material stack and a width of the third semiconductor portion of the first patterned material stack are narrowed, and in which the another first semiconductor portion of the second patterned material stack and the another third semiconductor portion of the second patterned material stack are completely removed so as to suspend the another second semiconductor portion and the another fourth semiconductor portion.

Referring now to FIG. 4, there is illustrated the exemplary semiconductor structure of FIG. 3 after performing a lateral etch in which a width of the exposed portions of the first semiconductor portion 12L of the first patterned material stack 20 and a width of the third semiconductor portion 16L of the first patterned material stack 20 are narrowed, and in which the another first semiconductor portion 12R of the second patterned material stack 22 and the another third semiconductor portion 16R of the second patterned material stack 22 are completely removed so as to suspend the another second semiconductor portion 14R and the another fourth semiconductor portion 18R.

Notably, the width of the first semiconductor portion 12L and the width of the third semiconductor portion 16L equal the first width of the first patterned material stack 20 prior to performing the lateral etch, and after etching the first semiconductor portion 12L and the third semiconductor portion 16L are narrowed to a third width that is less than the first width. After the lateral etch, the second semiconductor portion 14L and the fourth semiconductor material portion 18R maintain the first width of the first patterned material stack 20.

Prior to performing the lateral etch which provides the exemplary semiconductor structure shown in FIG. 4, an anchoring structure, such as a dummy gate or a pad region, can be formed to provide support for the suspended semiconductor portion 14R and the suspended another fourth semiconductor portion 18R. The anchoring structure can be formed by means known to one skilled in the art and would be located inside or outside the drawing view shown in FIG. 4.

In the areas of the structure in which the E-fuse is formed, the lateral etch partially removes exposed portions of the first semiconductor portion 12L and the third semiconductor portion 16L of the first patterned material stack 20, while simultaneously removing the another first semiconductor portion 12R and the another third semiconductor portion 16R of the second patterned material stack 22 and thus suspending the another second semiconductor portion 14R and the another fourth semiconductor portion 18R. In accordance with the present application, a lower portion of the first semiconductor portion 12L of the first patterned material stack 20 that is located between isolation structures 24 is not removed from the structure during the lateral etch, however, the lateral etch completes removes the another first semiconductor portion 12R from the structure including a lower portion that is present between the isolation structures 24. A gap 17 is formed in the area between the isolation structures 24 in the area of the semiconductor substrate 10 in which a semiconductor nanowire FET will be formed.

The remaining and narrowed (i.e., etched) first semiconductor portion 12L of the first patterned material stack 20 is labeled as 12L' in the drawings of the present application, and the remaining and narrowed (i.e., etched) third semiconductor portion 16L of the first patterned material stack 20 is labeled as 16L' in the drawings of the present application. As is shown in the drawings, the remaining and narrowed first semiconductor portion 12L' of the first patterned material stack 20 and the remaining and narrowed third semiconductor portion 16L' of the first patterned material stack 20 have outer edges that are vertically coincident to each other. The outer edges of the remaining and narrowed first semiconductor portion 12L' and the remaining and narrowed third semiconductor portion 16L' of the first patterned material stack 20 are vertically offset from the outer edges of the second semiconductor portion 14L of the first patterned material stack 20 and the fourth semiconductor portion 18L of the first patterned material stack 20. Notably, the outer edges of the remaining and narrowed first semiconductor portion 12L' of the first patterned material stack 20 and the remaining and narrowed third semiconductor portion 16L' of the first patterned material stack 20 do not extend beyond the outer edges of the second semiconductor portion 14L of the first patterned material stack 20 and the fourth semiconductor portion 18L of the first patterned material stack 20.

The suspended another second semiconductor portion 14R may be referred to herein as a bottom semiconductor nanowire 15b, while the suspended another fourth semiconductor portion 18R may be referred to herein as an upper semiconductor nanowire 15u. Collectively the upper semiconductor nanowire 15u and the bottom semiconductor nanowire 15b can be referred to as a stacked nanowire.

The lateral etch that is employed in the present application is selective for partially removing a portion of the first semiconductor portion 12L and the third semiconductor portion 16L relative to the second semiconductor portion 14L and the fourth semiconductor portion 18L of the first patterned material stack 20, while being selective for completely removing the another first semiconductor portion 12R and the another third semiconductor portion 16R relative to the another second semiconductor portion 14R and the another fourth semiconductor portion 18R of the second patterned material stack 22. An etch is selective if the rate of material for at least one material is greater than the rate of removal for at least one another material. For example and in one embodiment, a selective etch may include an etch chemistry that removes at least one material selectively to at least one another material by a ratio of 10:1 or greater. In one embodiment, and when the first semiconductor portion 12L, the another first semiconductor portion 12R, the third semiconductor portion 16L and the another third semiconductor portion 16R each comprise SiGe, and the second semiconductor portion 14L, the another second semiconductor portion 14R, the fourth semiconductor portion 18L and the another fourth semiconductor portion 18R each comprise Si, the etch chemistry can include $H_2O_2$.

Figure 5:
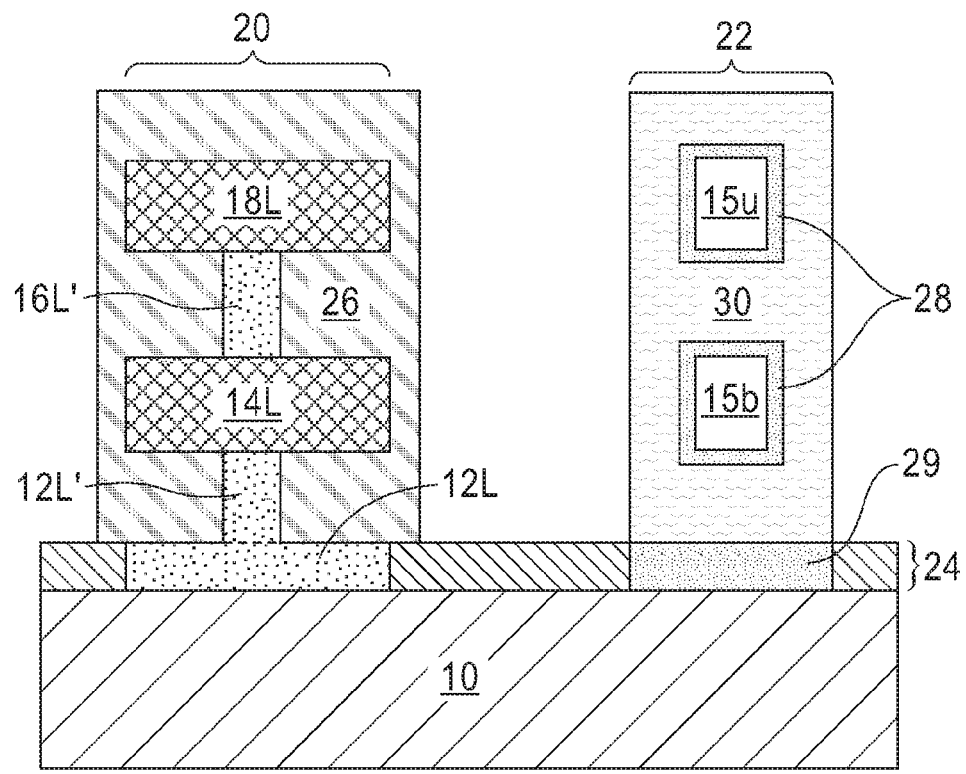
FIG. 5 is a cross sectional view of the exemplary semiconductor structure of FIG. 4 after forming a block mask protecting the first patterned material stack and after forming a gate structure surrounding the suspended another second semiconductor portion and the suspended another fourth semiconductor portion.

Referring now to FIG. 5, there is illustrated the exemplary semiconductor structure of FIG. 4 after forming a block mask 26 protecting the first patterned material stack 20 and after forming a gate structure surrounding the suspended another second semiconductor portion 14R (i.e. the bottom semiconductor nanowire 15b) and the suspended another fourth semiconductor portion 18R (i.e., the upper semiconductor nanowire 15u). The gate structure includes a gate dielectric portion 28, 29 and a gate conductor portion 30. Gate dielectric portion 29 is formed within gap 17 that is located between isolation structures in the semiconductor nanowire FET region, while dielectric portion 28 is formed surrounding (i.e., on a bottommost surface, a topmost surface, and sidewall surfaces) of the upper semiconductor nanowire 15u and the bottom semiconductor nanowire 15b. The gate conductor portion 30 straddles each semiconductor nanowire 15u, 15b in the semiconductor nanowire FET area.

The block mask 26 is formed protecting the first patterned material stack 20 prior to forming the gate structure. The block mask 26 may comprise a dielectric material including, for example, a dielectric oxide, a dielectric nitride, a dielectric oxynitride, a photoresist or any combination thereon. The block mask 26 can be formed by deposition of a block mask material, followed by lithography and etching.

After providing the block mask 26, the gate structure is formed. The gate structure formation begins by first forming the gate dielectric portions 28, 29. The gate dielectric portions 28, 29 may comprise a semiconductor oxide, such as silicon dioxide, or a high k material having a dielectric constant greater than silicon dioxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, or an alloy thereof. Each value of x is independently from 0.5 to 3 and each value of y is independently from 0 to 2.

The gate dielectric portions 28, 29 can be formed by any deposition technique including, for example, chemical vapor deposition (CVD), plasma enhanced chemical vapor deposition (PECVD), physical vapor deposition (PVD), sputtering, or atomic layer deposition. In one embodiment of the present application, the gate dielectric portions 28, 29 can have a thickness in a range from 1 nm to 10 nm. Other thicknesses that are lesser than or greater than the aforementioned thickness range can also be employed for the gate dielectric portions 28, 29.

The gate conductor portion 30 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor portion 20 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor portion 30 has a thickness from 1 nm to 100 nm. Other thicknesses that are lesser than or greater than the aforementioned thickness range can also be employed for the gate conductor portion 30.

With the block mask 26 in place, further semiconductor nanowire FET formation processes can be performed as are known to those skilled in the art. These further semiconductor nanowire FET formation processes are not described and illustrated herein so as not to obscure the formation of the E-fuse of the present application.

Figure 6:
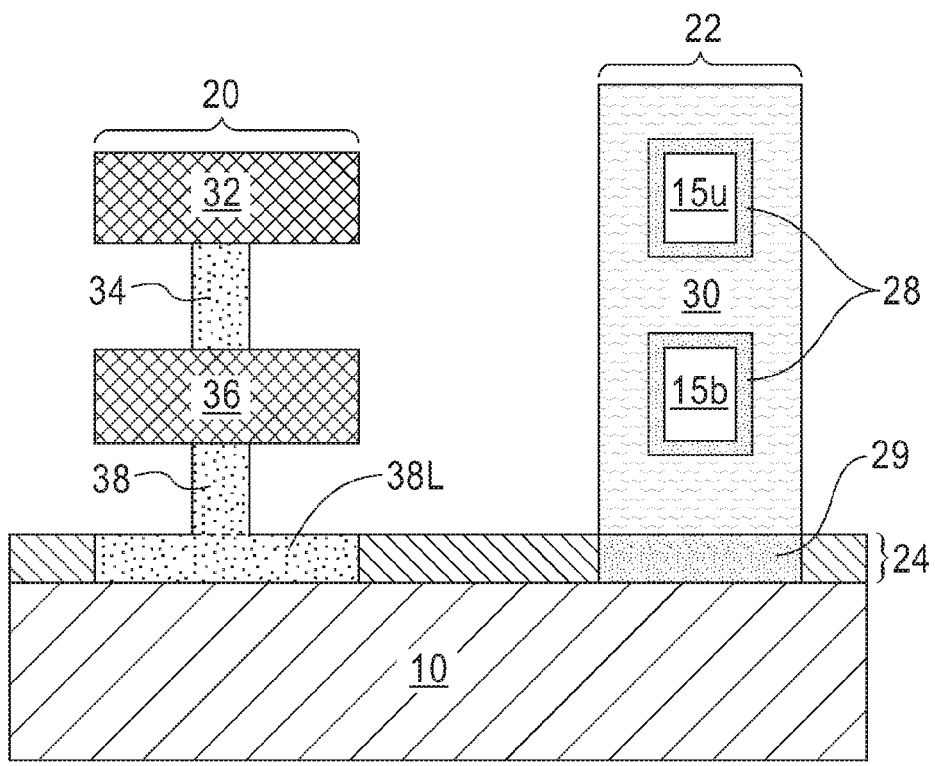
FIG. 6 is a cross sectional view of the exemplary semiconductor structure of FIG. 5 after removing the block mask and converting each remaining semiconductor portion of the first patterned material stack into metal semiconductor alloy portions.

Referring now to FIG. 6, there is illustrated the exemplary semiconductor structure of FIG. 5 after removing the block mask 26 and converting each remaining semiconductor portion of the first patterned material stack 20 into metal semiconductor alloy portions. Notably, the remaining portion of the first semiconductor portion 12L that is located between isolation structures 24 in the E-fuse area is converted into a base metal semiconductor alloy portion 38L, the remaining and narrowed first semiconductor material portion 12L' is converted into a first metal semiconductor alloy portion 38, the second semiconductor portion 14L is converted into a second metal semiconductor alloy portion 36, the remaining and narrowed third semiconductor portion 16L' is converted into a third metal semiconductor alloy portion 34, and the fourth semiconductor portion 18L is converted into a fourth metal semiconductor alloy portion 32.

The block mask 26 can be removed utilizing techniques well known to those skilled in the art. In one embodiment, an etch can be used to remove the block mask 26 from the structure. In another embodiment, a photoresist ashing step can be used to remove the block mask.

The metal semiconductor alloy portions 38L, 38, 36, 34, and 32 can be formed by first providing a layer of a metal semiconductor alloy forming metal (not shown) on all exposed surfaces of the first patterned material stack 20 shown in FIG. 5 after block mask 26 removal. The term "metal semiconductor alloy forming metal" is used throughout the present application to denote a metal that can react with an underlying semiconductor material to form a metal semiconductor alloy. Illustrative examples of metal semiconductor alloy forming metals that can be used in the present application include at least one of nickel (Ni), platinum (Pt), palladium (Pd), titanium (Ti), tungsten (W), and cobalt (Co). The metal semiconductor alloy forming metal can be formed by a deposition process including, for example, chemical vapor deposition, plasma enhanced chemical vapor deposition, atomic layer deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy metal that is formed can have a thickness from 5 to 15 nm. Other thicknesses that are greater than or lesser than the aforementioned thickness range can also be employed as the thickness of the metal semiconductor alloy forming metal.

After providing the metal semiconductor alloy forming metal and in some embodiments of the present application, a diffusion barrier (not shown) can be formed on an exposed upper surface of the metal semiconductor alloy forming metal. In another embodiment of the present application, no diffusion barrier is provided on the exposed upper surface of the metal semiconductor alloy forming metal. When present, the diffusion barrier can include a metal nitride such as, for example, TiN or TaN, and any deposition process including those mentioned above for providing the metal semiconductor alloy forming metal may be used. When present, the diffusion barrier can have a thickness from 1 nm to 20 nm.

Next, an anneal is performed under conditions that are effective in causing the metal semiconductor alloy forming metal to diffuse into the semiconductor material portions 12L, 12L', 14L, 16L' and 18L, forming a metal semiconductor alloy. The metal semiconductor alloy formation anneal may be performed in a single step or a two-step anneal can be used. In one embodiment, the metal semiconductor alloy formation anneal can be performed at a temperature of from 300° C. to 800° C. In another embodiment, the metal semiconductor alloy formation anneal can be performed at a temperature of from 350° C. to 500° C. The metal semiconductor alloy formation anneal is typically performed in an inert ambient including, for example, argon, helium, neon and/or nitrogen. The metal semiconductor alloy formation anneal can be performed utilizing a rapid thermal anneal, a spike anneal, a microwave anneal or a laser anneal. Following the metal semiconductor alloy formation anneal, the optional diffusion barrier and any unreacted metal semiconductor alloy forming metal can be removed utilizing one or more etch processes.

In accordance with the present application, the base metal semiconductor alloy portion 38L, the first metal semiconductor alloy portion 38, and the third metal semiconductor alloy portion 34 are comprised of a same metal semiconductor alloy. The base metal semiconductor alloy portion 38L and the first metal semiconductor alloy portion 38 are of unitary construction, i.e., they are a single piece lacking any defined interface.

In accordance with the present application, the second metal semiconductor alloy portion 36, and the fourth metal semiconductor alloy portion 32 comprise a same metal semiconductor alloy which differs from the metal semiconductor alloy of the base metal semiconductor alloy portion 38L, the first metal semiconductor alloy portion 38, and the third metal semiconductor alloy portion 34. For example, the base metal semiconductor alloy portion 38L, the first metal semiconductor alloy portion 38, and the third metal semiconductor alloy portion 34 may each comprise a Ni silicon germanide alloy, while the second metal semiconductor alloy portion 36 and the fourth metal semiconductor alloy portion 32 may comprise a Ni silicide.

In the exemplary semiconductor structure shown in FIG. 6, the fourth metal semiconductor alloy portion 32 comprises the anode or the cathode of the E-fuse of the present application, the third metal semiconductor portion 34 comprises a link portion of the E-fuse of the present application, and the second metal semiconductor portion 36 comprises the other of the anode or cathode portion of the E-fuse structure of the present application which is not provided for by the fourth metal semiconductor alloy portion 32. Furthermore, the linked portion of the E-fuse of the present application provided for by the third metal semiconductor alloy portion 34 has outer edges that are vertically offset and do not extend beyond outermost edges of both the fourth metal semiconductor alloy portion 32 and the second metal semiconductor alloy portion 36. Outer edges of the fourth metal semiconductor alloy portion 32 and the second metal semiconductor alloy portion 36 of the E-fuse of the present application however are vertically aligned.

The second metal semiconductor alloy portion 36 of the E-fuse of the present application is in contact with the surface of the semiconductor substrate 10 through the first metal semiconductor alloy portion 38 and the base metal semiconductor alloy portion 38L. As is shown, the first metal semiconductor alloy portion 38 of the E-fuse structure of the present application has outer edges that are vertically coincident with outer edges of the third metal semiconductor portion 34, while the base metal semiconductor alloy portion 38L has outer edges that are vertically coincident to the outer edges of both the fourth metal semiconductor alloy portion 32 and the second metal semiconductor alloy portion 36.

FIG. 6 illustrates an e-Fuse of the present application. As is shown, the E-fuse is located in one area of a semiconductor substrate. The E-fuse includes a vertical stack of from, bottom to top, a base metal semiconductor alloy portion 38L, a first metal semiconductor alloy portion 38, a second metal semiconductor portion 36, a third metal semiconductor alloy portion 34 and a fourth metal semiconductor alloy portion 32, wherein the first metal semiconductor alloy portion 38 and the third metal semiconductor portion 34 have outer edges that are vertically offset and do not extend beyond vertical edges of the second metal semiconductor alloy portion 36 and the fourth metal semiconductor alloy portion 32.

At this point of the present application, a metal contact structure (not shown in FIG. 6) can be formed. The metal contact structure can include forming an interconnect dielectric material on the structure shown in FIG. 6. The interconnect dielectric material may comprise any interlevel or intralevel dielectric including inorganic dielectrics or organic dielectrics. Some examples of suitable dielectrics that can be used as the interconnect dielectric material include, but are not limited to, $SiO_2$, doped glass, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material typically has a dielectric constant that is about 4.0 or less, with a dielectric constant of about 2.8 or less being more typical. All dielectric constants mentioned herein are relative to a vacuum, unless otherwise noted. The interconnect dielectric material has an upper surface that is located above an upper surface of the fourth metal semiconductor alloy portion 32. In one embodiment of the present application, the thickness of the interconnect dielectric material can be from 50 nm to 1000 nm. Other thicknesses that are greater than or lesser than the aforementioned thickness range can also be employed for the interconnect dielectric material. The interconnect dielectric material can be formed utilizing a deposition process including, for example, chemical vapor deposition, plasma enhanced chemical vapor deposition, evaporation or spin-on coating.

Following the formation of the interconnect dielectric material, the interconnect dielectric material can be patterned by lithography and etching to form at least one contact opening that extends from an upper surface of the interconnect dielectric material to an upper surface of the fourth metal semiconductor alloy portion 32 and at least one other contact opening that extends to a surface of the base metal semiconductor alloy portion 38L. Each contact opening that is formed may have substantially vertical sidewalls or the sidewalls of each contact opening may have some tapering associated therein. In one embodiment, the width of each contact opening at a bottom portion of the contact opening is less than the width at an upper portion of the contact opening.

A conductive material is then deposited filling each contact opening. The conductive material that is deposited may include for example, at least one of copper, tungsten, and aluminum. In one embodiment, the conductive material that fills each contact opening comprises copper or a copper alloy such as, for example, a copper-aluminum alloy. The conductive material may be formed by a deposition process including chemical vapor deposition (CVD), plasma enhanced chemical vapor deposition (PECVD), sputtering, or chemical solution deposition. Alternatively, a plating process that fills each contact opening from the bottom upwards can be used. After depositing the conductive material, a planarization process such as, for example, chemical mechanical polishing (CMP) and/or grinding, can be employed to remove portions of the conductive material that extends above the mouth of each contact opening that is formed into interconnect dielectric material. The above steps provide contact structure(s) into interconnect dielectric material.

It is noted that although the above embodiment is described and illustrated as forming one E-fuse with the E-fuse area of the semiconductor substrate 10 and one semiconductor nanowire FET within the FET area of the semiconductor substrate 10, a plurality of E-fuses can be provided forming an E-fuse array within the E-fuse area of the semiconductor substrate 10, and a plurality of semiconductor nanowire FETs can be provided forming an array of semiconductor nanowires within the FET area of the semiconductor substrate 10.

Figure 7A:
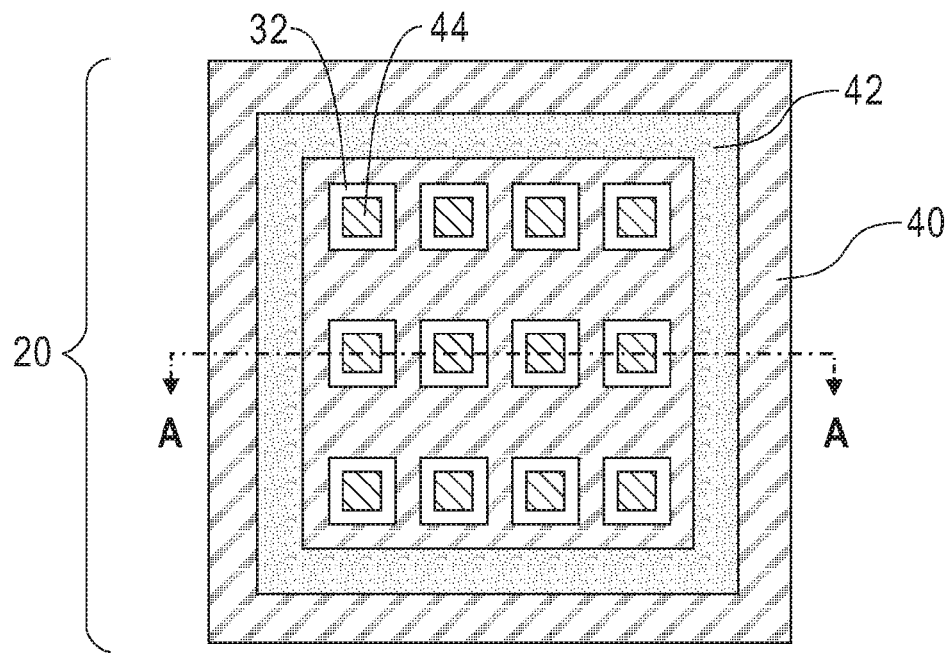
FIG. 7A is a top down view showing an exemplary E-fuse array structure of the present application.
Figure 7B:
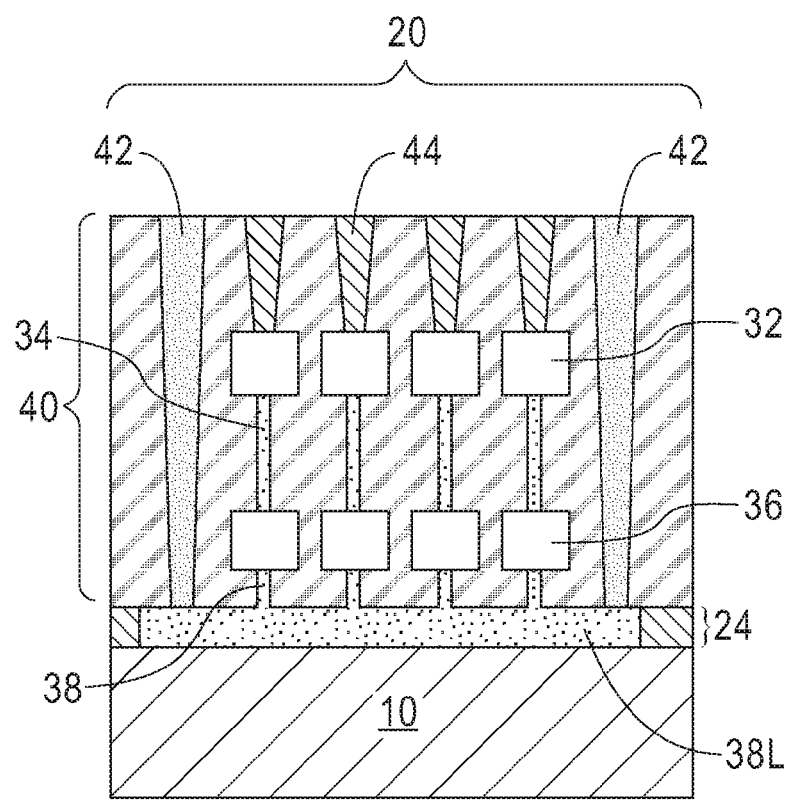
FIG. 7B is a cross sectional view showing the exemplary E-fuse array structure of FIG. 7A along plane A-A.

FIGS. 7A-7B are various views showing an exemplary E-fuse array structure of the present application. The E-fuse array shown in FIGS. 7A-7B includes the same elements as described above in FIGS. 1-6 and the E-fuse array can be formed utilizing the basic processing steps of the present application as also described above. The E-fuse array further includes a contact structure that includes interconnect dielectric material 40, conductive filled contacts 42, and conductive filled contacts 44. The conductive filled contacts 42 extend from an upper surface of the interconnect dielectric material 40 down to an upper surface of base metal semiconductor alloy portion 38L, while the conductive filled contacts extend from an upper surface of the interconnect dielectric material 40 down to an upper surface of each fourth metal semiconductor portion 44.

While the present application has been particularly shown and described with respect to various embodiments thereof, it will be understood by those skilled in the art that the foregoing and other changes in forms and details may be made without departing from the spirit and scope of the present application. It is therefore intended that the present disclosure not be limited to the exact forms and details described and illustrated, but fall within the scope of the appended claims.

What is claimed is:

1. A semiconductor structure comprising:
an E-fuse located in one area of a semiconductor substrate, wherein said E-fuse comprises a vertical stack of from, bottom to top, a base metal semiconductor alloy portion, a first metal semiconductor alloy portion, a second metal semiconductor portion, a third metal semiconductor alloy portion and a fourth metal semiconductor alloy portion, wherein said first metal semiconductor alloy portion and said third metal semiconductor portion have outer edges that are vertically offset and do not extend beyond vertical edges of said second metal semiconductor alloy portion and said fourth metal semiconductor alloy portion.

2. The semiconductor structure of claim 1, wherein said vertical edges of the first metal semiconductor alloy portion and said third metal semiconductor portion are vertically coincident to each other, and wherein said vertical edges of said second metal semiconductor alloy portion and said fourth metal semiconductor alloy portions are vertically coincident to each other.

3. The semiconductor structure of claim 1, wherein said first and third metal semiconductor alloy portions comprise a first metal semiconductor alloy and said second and fourth metal semiconductor alloy portions comprise a second metal semiconductor alloy, and wherein said first metal semiconductor alloy is different from said second metal semiconductor alloy.

4. The semiconductor structure of claim 3, wherein said first metal semiconductor alloy comprises a Ni silicon germanide, and said second metal semiconductor alloy comprises a Ni silicide.

5. The semiconductor structure of claim 1, wherein an isolation structure is present adjacent each sidewall of said base metal semiconductor alloy portion and on said uppermost surface of said semiconductor substrate.

6. The semiconductor structure of claim 1, further comprising at least one semiconductor nanowire FET located in another area of said semiconductor substrate.

7. The semiconductor structure of claim 6, wherein said at least one semiconductor nanowire FET comprises a pair of stacked and suspended semiconductor nanowires.

8. The semiconductor structure of claim 7, wherein a gate structure is present surrounding each pair of stacked and suspended semiconductor nanowires.

9. The semiconductor structure of claim 8, wherein said gate structure includes a gate dielectric portion located on an uppermost surface, a bottommost surface and sidewalls of each of said pair of stacked and suspended semiconductor nanowires.

10. The semiconductor structure of claim 6, further comprises an isolation structure located on a portion of said semiconductor substrate and separating said E-fuse from said at least one semiconductor nanowire FET.

11. A semiconductor structure comprising:
an E-fuse located in one area of a semiconductor substrate, wherein said E-fuse comprises a vertical stack of from, bottom to top, a base metal semiconductor alloy portion, a first metal semiconductor alloy portion, a second metal semiconductor portion, a third metal semiconductor alloy portion and a fourth metal semiconductor alloy portion, wherein said first metal semiconductor alloy portion and said third metal semiconductor portion have outer edges that are vertically offset and do not extend beyond vertical edges of said second metal semiconductor alloy portion and said fourth metal semiconductor alloy portion; and
an isolation structure present adjacent each sidewall of said base metal semiconductor alloy portion and on uppermost surface of said semiconductor, wherein a topmost surface of said isolation structure is coplanar with a topmost surface of said base metal semiconductor alloy portion and a bottommost surface is coplanar with a bottommost surface of said isolation structure of said base metal semiconductor alloy portion.

12. The semiconductor structure of claim 11, wherein said vertical edges of the first metal semiconductor alloy portion and said third metal semiconductor portion are vertically coincident to each other, and wherein said vertical edges of said second metal semiconductor alloy portion and said fourth metal semiconductor alloy portions are vertically coincident to each other.

13. The semiconductor structure of claim 11, wherein said first and third metal semiconductor alloy portions comprise a first metal semiconductor alloy and said second and fourth metal semiconductor alloy portions comprise a second metal semiconductor alloy, and wherein said first metal semiconductor alloy is different from said second metal semiconductor alloy.

14. The semiconductor structure of claim 13, wherein said first metal semiconductor alloy comprises a Ni silicon germanide, and said second metal semiconductor alloy comprises a Ni silicide.

15. The semiconductor structure of claim 11, further comprising at least one semiconductor nanowire FET located in another area of said semiconductor substrate.

16. The semiconductor structure of claim 15, wherein said at least one semiconductor nanowire FET comprises a pair of stacked and suspended semiconductor nanowires.

17. The semiconductor structure of claim 16, wherein a gate structure is present surrounding each pair of stacked and suspended semiconductor nanowires.

18. The semiconductor structure of claim 17, wherein said gate structure includes a gate dielectric portion located on an uppermost surface, a bottommost surface and sidewalls of each of said pair of stacked and suspended semiconductor nanowires.

* * * * *